(12) United States Patent
Arnaud et al.

(10) Patent No.: US 10,075,102 B2
(45) Date of Patent: Sep. 11, 2018

(54) SYSTEM FOR CONVERTING THERMAL ENERGY INTO ELECTRICAL POWER

(71) Applicant: STMicroelectronics (Crolles 2) SAS, Crolles (FR)

(72) Inventors: Arthur Arnaud, Poisy (FR); Jihane Boughaleb, Grenoble (FR); Stephane Monfray, Eybens (FR); Thomas Skotnicki, Crolles-Montfort (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 324 days.

(21) Appl. No.: 15/139,151

(22) Filed: Apr. 26, 2016

(65) Prior Publication Data

US 2017/0117823 A1    Apr. 27, 2017

(30) Foreign Application Priority Data

Oct. 26, 2015 (FR) .................................... 15 60185

(51) Int. Cl.
| | |
|---|---|
| *H01L 41/113* | (2006.01) |
| *H02N 2/18* | (2006.01) |
| *H02N 3/00* | (2006.01) |
| *F03G 7/06* | (2006.01) |

(52) U.S. Cl.
CPC ................. *H02N 2/18* (2013.01); *F03G 7/06* (2013.01); *H01L 41/1134* (2013.01); *H02N 3/00* (2013.01)

(58) Field of Classification Search
CPC ............... H01L 41/113; H01L 41/1132; H01L 41/1134; H01L 41/1136; H01L 41/1138; H02N 2/18; H02N 3/00

USPC .................................................. 310/307, 339
See application file for complete search history.

(56) References Cited

U.S. PATENT DOCUMENTS

| | | |
|---|---|---|
| 2008/0100181 A1 | 5/2008 | Clingman et al. |
| 2013/0257219 A1 | 10/2013 | Monfray et al. |
| 2015/0115769 A1 | 4/2015 | Savelli et al. |
| 2015/0300328 A1 | 10/2015 | Puscasu et al. |

FOREIGN PATENT DOCUMENTS

| | | |
|---|---|---|
| EP | 2309560 A1 | 4/2011 |
| EP | 2312154 A1 | 4/2011 |
| WO | WO-2007087383 A2 | 8/2007 |
| WO | WO-2013007693 A1 | 1/2013 |

OTHER PUBLICATIONS

Arnaud, A. et al: "Piezoelectric and Electrostatic Bimetal-Based Thermal Energy Harvesters," Journal of Physics: Conference Series 476 (2013) 012062 (6 pages).

(Continued)

*Primary Examiner* — Derek Rosenau
(74) *Attorney, Agent, or Firm* — Crowe & Dunlevy

(57) ABSTRACT

A system for converting thermal energy into electrical power includes a temperature-sensitive element held in a frame by its two ends between a heat source and a cold source producing a thermal gradient. A piezoelectric element is positioned between the frame and at least one end of the temperature-sensitive element. The temperature-sensitive element is configured to deform cyclically between two states under the action of the thermal gradient. With each cyclic deformation, a stress is applied to the piezoelectric element via the one end.

15 Claims, 3 Drawing Sheets

(56) References Cited

OTHER PUBLICATIONS

Boisseau, S., et al: "Semi-Flexible Bimetal-Based Thermal Energy Harvesters," Smart Materials and Structures (2013) 22, 025021 (11 pages).
INPI Search Report and Written Opinion for FR 1560185 dated Jun. 23, 2016 (7 pages).
Puscasu, O.: "A Disruptive Technology for Thermal to Electrical Energy Conversion," Therminic Conference, Sep. 25-27, 2012, Budapest, Hungary (3 pages).
Ravindran, SKT, et al: "Analysis of a Bimetallic Micro Heat Engine for Energy Harvesting," Smart Materials and Structures, Struct. 23 (2014) 035011 (14 pages).

SYSTEM FOR CONVERTING THERMAL ENERGY INTO ELECTRICAL POWER

PRIORITY CLAIM

This application claims priority from French Application for Patent No. 15 60 185 filed Oct. 26, 2015, the disclosure of which is incorporated by reference.

TECHNICAL FIELD

Embodiments relate to thermoelectric transducers, in particular in the context of the recovery of the thermal energy produced by electronic circuits in operation. It is envisioned to recover this thermal energy in order to convert it at least in part into electrical power.

BACKGROUND

Temperature-sensitive elements are known that allow thermal energy to be converted into mechanical energy, especially by virtue of structures having a very high aptitude to deform under the effect of temperature. It may for example be a question of bimetallic strips (or bimetals). A bimetal comprises flexible strips (or membranes) of two different metal alloys with different thermal expansion coefficients, which strips are soldered or adhesively bonded face-to-face one against the other.

Below, Ksup and Kinf respectively designate the thermal coefficients of the membranes of the bimetal, where Ksup>Kinf, whereas MKsup and MKinf designate the corresponding membranes, referred to as the high-expansion membrane and the low-expansion membrane, respectively.

When a bimetal is heated, the high-expansion membrane MKsup tends to expand more than the low-expansion membrane MKinf, and the bimetal curves with a radius of curvature in the direction membrane MKsup toward membrane MKinf.

In contrast, when a bimetal is cooled, the high-expansion membrane MKsup tends to contract more than the low-expansion membrane MKinf, and the bimetal curves with a radius of curvature in the direction membrane MKinf toward membrane MKsup.

Thus, if the bimetal is repeatedly heated and cooled, its curvature reverses the same number of times. The reversals in curvature occur abruptly, the bimetal snapping from a first stable position to a second stable position; "bistability" is thus spoken of.

Thus, when a bimetal is placed between a heat source and a cold source, it oscillates from one stable position to the other cyclically. Such a cycle is illustrated in FIG. 1.

The curve H represents the variation in the vertical position Z of the middle of the curvature of the bimetal relative to a median position as a function of temperature T, and forms a hysteresis cycle. When the bimetal is heated from a first stable position 11, the curve remains substantially constant until a first snap-transition temperature Tc1, shown at the point 12.

At the temperature Tc1, passage from the point 12 to the point 13 leads to an abrupt reversal in the curvature. At the point 13, the bimetal is then in its second stable position.

Passage from the point 13 to the point 14 corresponds to a decrease in the temperature of the bimetal, the curvature remaining substantially constant to the point 14, at a second snap-transition temperature Tc2.

At the temperature Tc2, the passage from the point 14 to the point 11 leads to an abrupt reversal in the curvature. At the point 11, the bimetal has returned to its first stable position.

On each passage from one stable position to the other, curvature decreases then increases. The decrease in the curvature of the arc formed by the bimetal naturally leads to an elongation of the chord, and a resultant longitudinal force is thus generated at the ends of the bimetal on each snap transition.

Devices are also known for converting mechanical energy into electrical power, for example implementing the properties of piezoelectric materials. A piezoelectric material is a material that, when it is subjected to a mechanical deformation, generates an electrical voltage.

In the prior art, systems are known that combine a bimetal and a piezoelectric element in order to convert thermal energy into electrical power. The bimetal is generally placed between a heat source and a cold source and alternates from one curvature to the other cyclically, and the piezoelectric element is generally under tensile stress and especially of the type designated "3-1" in the art.

Such a system is especially described in patent application United States Patent Publication No. 2015/0115769 A1 (incorporated by reference), in which the piezoelectric element is a cantilever fastened to the bimetal. The suspended piezoelectric element is stimulated to vibrate when the bimetal changes position.

Another prior-art system has a piezoelectric element placed against one of the temperature sources. During a snap transition, some of the kinetic energy of the bimetal is transferred to the piezoelectric element by mechanical shock.

Current embodiments have many drawbacks, in particular: their mechanical and thermal transfer efficiencies are limited; their piezoelectric efficiency is undesirably affected by temperature; thermal energy diffuses into the piezoelectric element; their working frequency is low; mechanical energy is lost to the holder; or their structures may even lead to problems positioning and encapsulating elements of the system.

SUMMARY

According to one embodiment, a system is provided for converting thermal energy into electrical power, this system combining a bimetallic strip and a piezoelectric element and especially having a better transfer efficiency, a better energy conversion efficiency and an optimized operating mode while nonetheless being simple to fabricate.

According to one aspect, a system is provided for converting thermal energy into electrical power, comprising: a frame, at least one temperature-sensitive element held in the frame by two of its ends between a heat source and a cold source, and at least one piezoelectric element placed between at least one portion of the frame and at least a first of said two ends of said at least one temperature-sensitive element, said at least one temperature-sensitive element being configured to deform cyclically between two states under the action of the thermal gradient between the heat source and the cold source while exerting a stress during its cyclic deformation on said at least one piezoelectric element via said at least one first end.

Thus, this configuration makes it possible to decrease the number of intermediate elements during the conversion of thermal energy into mechanical energy and during the conversion of mechanical energy into electrical power. This leads to a better overall system efficiency.

Specifically, in contrast to the examples of the prior art presented above, in this configuration there is no heat-diffusing element between the temperature sources and the temperature-sensitive element. Likewise, since the piezoelectric element makes direct contact with one end of the temperature-sensitive element, the mechanical stress is applied directly to the piezoelectric element during each snap transition.

Said stress on the piezoelectric element may be a compressive stress.

Specifically, the snap transition of a bimetal generates a longitudinal mechanical stress at its ends, causing, in this configuration, compression of the piezoelectric element(s).

According to one embodiment, the temperature-sensitive element makes, when it is in at least one of its shapes, contact with one or other of the heat source and cold source, or is very near thereto.

This makes it possible to optimize heat transfer between the temperature-sensitive element and at least one of the heat sources.

Thus, the temperature of the temperature-sensitive element rapidly reaches the snap-transition temperatures, and the repetition frequency of the deformation cycle is optimized.

According to one embodiment, the temperature-sensitive element comprises a bimetallic strip, or bimetal.

The high-expansion membrane of the bimetal may comprise an iron/nickel/chromium alloy, for example the alloy of stoichiometry Fe 75%/Ni 22%/Cr 3% known as $NC_4$. The low-expansion membrane of the bimetal may comprise an iron/nickel alloy, for example the alloy of stoichiometry Fe 64%/Ni 36% known as Invar.

A bimetal formed by the pair of materials $NC_4$/Invar has advantageous properties as regards the efficiency of conversion of thermal energy into electrical power, because of its high thermal-mechanical coupling coefficient, as regards delivered mechanical power, and facilitates shaping and sizing of the bistability characteristics (snap-transition temperatures, amplitude, etc.).

The temperature-sensitive element may be stamped in its center.

Specifically, a stamp or a mark, for example forming a circular edge on the surface of the bimetallic strip, gives an initial curvature to the bimetal and especially allows the snap-transition effect to be improved, and thus the hysteresis cycle of the bimetallic strip to be tailored to the requirements (snap-transition temperatures, amplitude, etc.).

According to one embodiment, at least one fastening element is placed between said at least one first end of the temperature-sensitive element and the piezoelectric element, and is configured to hold the temperature-sensitive element by said at least one first end.

Such a fastening element, in addition to holding the temperature-sensitive element in the correct position, prevents direct contact between the piezoelectric element and the temperature-sensitive element, for example protecting the piezoelectric element from mechanical wear or undesired heat exchange.

In addition, such a fastening element allows the stress to be uniformly applied to an advantageous area of the piezoelectric element.

The fastening element may preferably be a shape that ensures that the temperature-sensitive element is satisfactorily held and that exerts a minimum of mechanical stresses during the shape changes.

According to one embodiment, the piezoelectric element comprises a stack of layers of a piezoelectric material, PZT for example, forming a stack of piezoelectric capacitors connected in parallel, and is generally a stack of the type designated "3-3 piezoelectric stack" by those skilled in the art.

When a 3-3 piezoelectric stack is compressively stressed, an electric field is generated in the direction of the stress and the capacitances of the stacked layers decrease. As a consequence, a high electromechanical coupling factor is achieved in this direction, ensuring that the mechanical energy is efficiently converted into electrical power.

By way of example, 3-3 piezoelectric stacks have an electromechanical coupling factor higher than 3-1 piezoelectrics, about 0.75 versus about 0.39, respectively, equivalent to 57% of the mechanical energy being converted into electrical power versus 15%, respectively.

According to one embodiment, the piezoelectric element is insulated from the transfer of heat between said heat source and said cold source.

The thermal insulation makes it possible to avoid undesirable temperature effects on the piezoelectric element, and thus the other heat exchanges may be optimized without negatively affecting the collection of energy.

For example, said frame may be thermally insulating, allowing the piezoelectric element to be insulated from the heat exchange and thus a high thermal gradient to be maintained inside the system.

According to another aspect, an energy-recovering device is provided comprising an energy-converting system such as defined above, and power-storing means coupled to the piezoelectric element and configured to store the power produced by the piezoelectric element.

Such a device may especially be used as a power source for autonomous systems with very low power consumptions.

BRIEF DESCRIPTION OF THE DRAWINGS

Other advantages and features of the invention will become apparent on examining the detailed description of completely non-limiting embodiments, and the appended drawings, in which.

DETAILED DESCRIPTION

Figure 2:
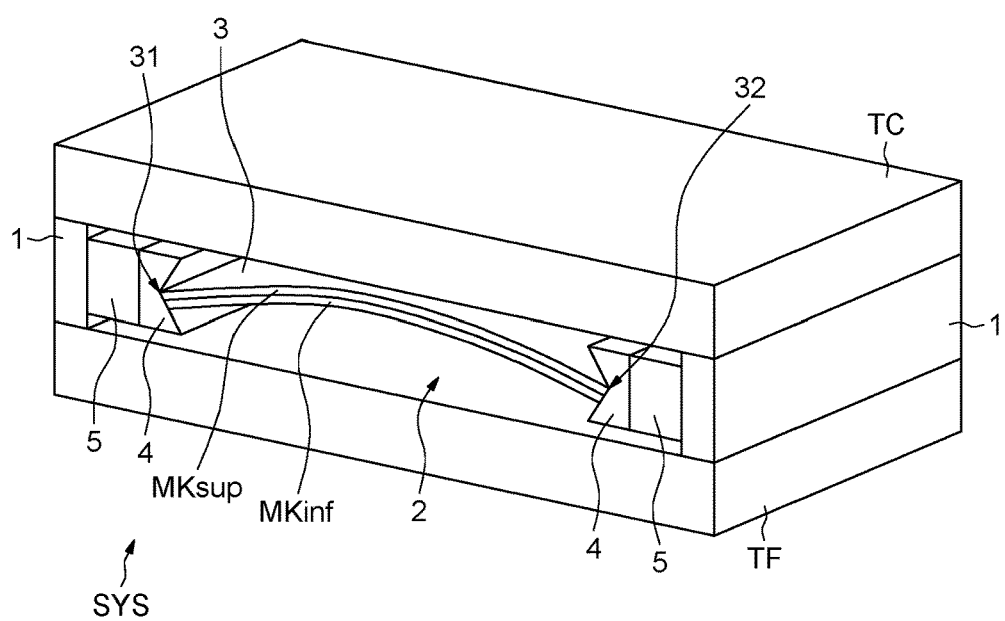
FIGS. 2 to 6 schematically illustrate various embodiments of an energy-converting system according to the invention.
Figure 3:
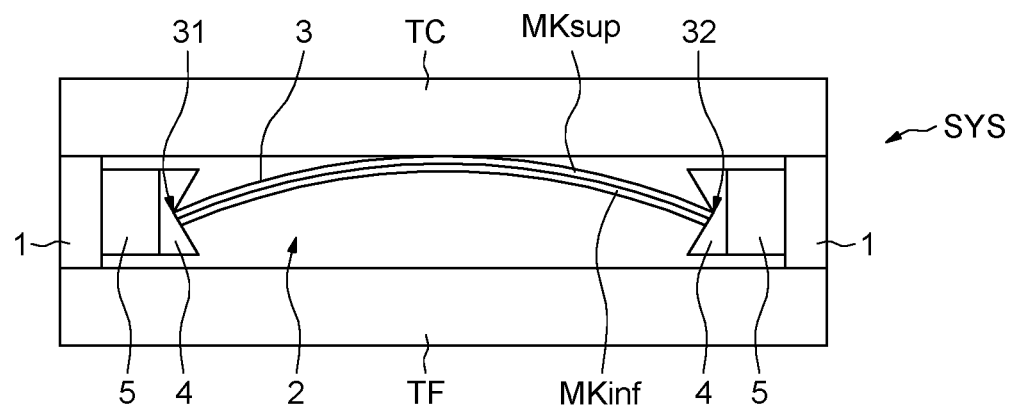
Figure 4:
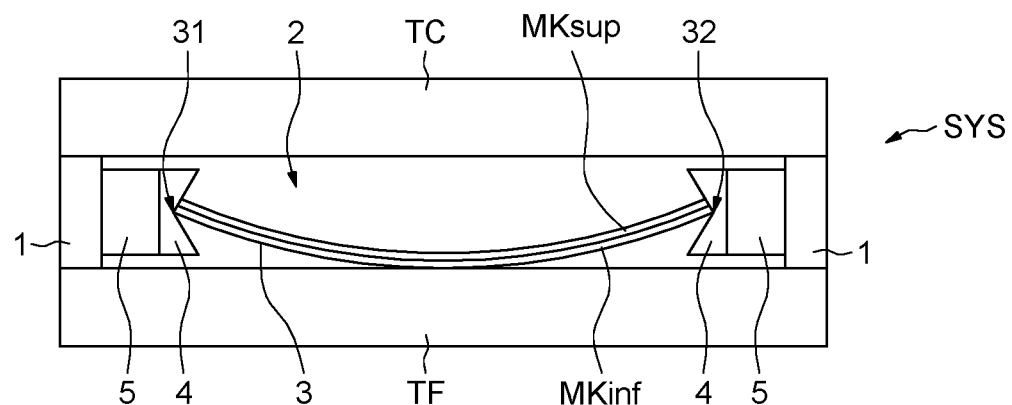

FIGS. 2, 3 and 4 respectively show a perspective view and side views of one embodiment of a system SYS, elements common to said figures being referenced with the same references.

In this embodiment, a heat source TC and a cold source TF are joined, one facing the other, by a thermally insulating frame 1 forming a free space 2 between them.

A bimetallic strip or bimetal 3, of rectangular shape and curved lengthwise, is placed in the free space 2. The bimetallic strip 3 comprises a high-expansion membrane MKsup of thermal expansion coefficient Ksup and a low-expansion membrane MKinf of thermal expansion coefficient Kinf, said membranes being adhesively bonded face-to-face.

The bimetallic strip 3 bears against and is held by, via the edges 31, 32 of its longitudinal ends, two fastening elements 4 that bear against and/or are fastened to stacks 5 of 3-3 piezocomposites that themselves bear against and/or are fastened to that face of the frame 1 which is oriented toward the space 2.

The fastening elements 4 are thermally insulating and here comprise a sort of groove of triangular cross section into which the edges 31, 32 of the strip 3 are lodged, the strip 3 thus being correctly held while remaining free to reverse shape.

The face opposite the groove of the fastening elements 4 is flat and its area corresponds to an advantageously active area of the piezocomposite stacks 5.

Figure 1:
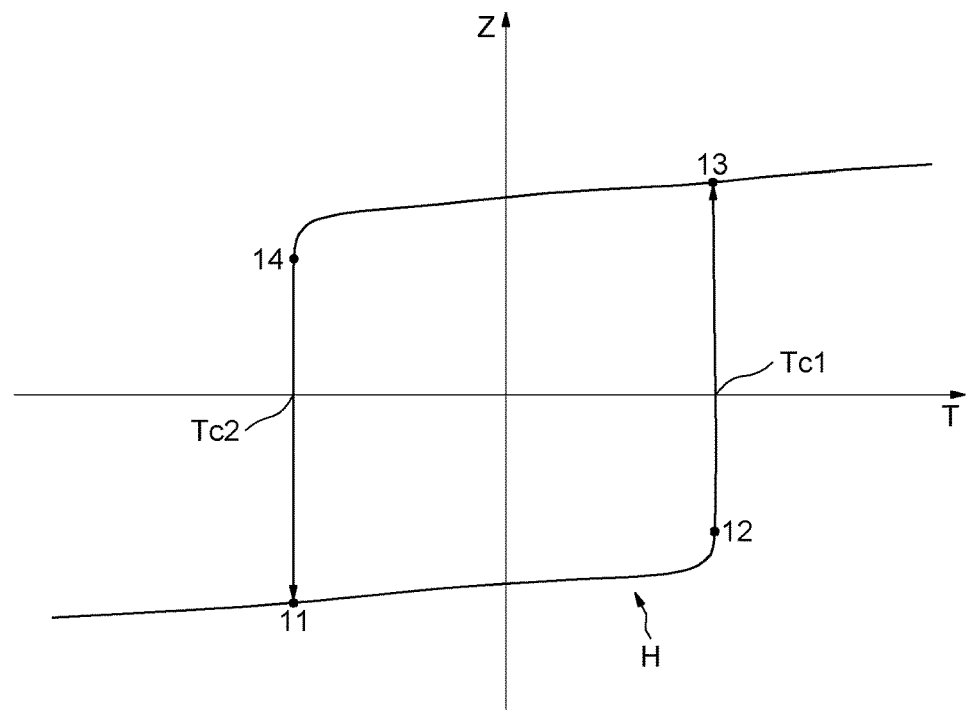
FIG. 1 described above illustrates the hysteresis cycle of the position of a bimetal as a function of temperature.

In FIGS. 2 and 3, the bimetallic strip 3 is shown in a first stable position, making contact with the heat source TC, and corresponds to a position between points 11 and 12 of the hysteresis cycle H shown in FIG. 1.

In FIG. 4, the strip 3 is in its second stable position, making contact with the cold source TF, and corresponds to a position between points 13 and 14 of the hysteresis cycle H shown in FIG. 1.

By way of example, the temperatures of the heat source TC and cold source TF may be comprised in a wide range extending from −40° C. to 300° C. The snap-transition temperatures Tc1 and Tc2 may have any value in this range, where Tc1>Tc2, and are set by the choice of the materials of the bimetal, by the dimensions of the bimetal, and by the initial curvature given to the bimetal.

For a given bimetal with snap-transition temperatures Tc1 and Tc2 to operate, the temperature of the cold source TF must be below the snap-transition temperature Tc2 and the temperature of the heat source TC must be above the snap-transition temperature Tc1.

Furthermore, the heat source TC and cold source TF shown are regular-parallelepiped shaped, but it is possible to envision them being any shape and having concave or convex surfaces for example, and likewise it is possible for the groove of the fastening elements 4 to be another shape, for example of curved cross section.

Figure 5:
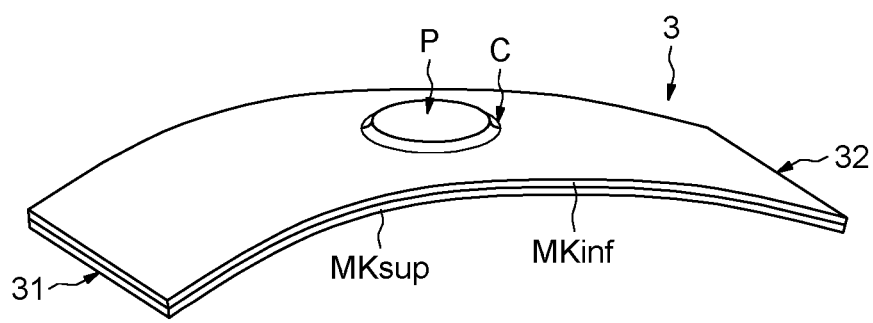

FIG. 5 shows one embodiment of the bimetallic strip 3 comprising a stamp P in its middle. This stamp P creates a circular bend C in the surface of the bimetallic strip 3, the geometry of which especially allows the snap-transition temperatures and the hysteresis cycle to be controlled.

The bimetallic strip 3 may have macroscopic dimensions, of the order of one $cm^2$, and in this case the membranes may comprise an iron/nickel alloy of various stoichiometries, such as Invar (Fe 64%/Ni 36%) for example. These alloys may also contain chromium and/or manganese to increase their thermal expansion coefficients, such as for example $NC_4$ (Fe 75%/Ni 22%/Cr 3%) or even the alloys (Mn 72%/Cu 18%/Ni 10%) and (Fe 74%/Ni 20%/Mn 6%). Other metals may be used, such as for example aluminum or copper.

The strip 3 has a thickness of about a few tenths of a millimeter, in order to minimize its volume and accelerate the heating and cooling of its mass, and therefore increase the repetition frequency of the deformation cycle.

The bimetallic strip may also be of micron-size dimensions, and the membranes may be produced in thin-film technology, associating materials such as Si/Al, $SiO_2$/Al, Si/Au, $SiO_2$/Au and SiPb for example, over thicknesses of a few tens of microns.

This being so, the temperature-sensitive element may also be formed from a shape-memory alloy having memorized two shapes. The shape-memory alloys may for example be made Cu/Zn, Cu/Zn/Al, Cu/Ni/Al, Au/Cd and/or Fe/Pt.

In any case, the stoichiometry of the materials is chosen depending on the temperature range of use set by the hot and cold sources.

Figure 6:
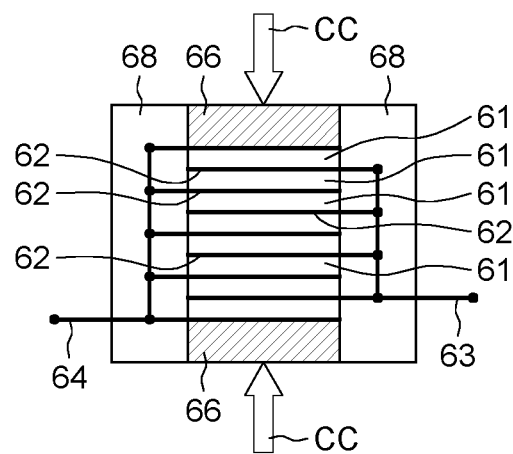

FIG. 6 shows a cross-sectional view of a 3-3 piezoelectric stack, comprising a stack of layers 61 of a piezoelectric material. The piezoelectric material may for example be PZT, or a piezocomposite comprising a piezoelectric material and a non-piezoelectric material.

Each layer 61 is connected to the neighboring layers by electrodes 62, forming as many piezoelectric capacitors.

The electrodes 62 are alternately connected to nodes 63 and 64 that then form the terminals of the equivalent piezoelectric capacitor of the parallel-connected piezoelectric capacitors of each layer.

The ends of the stack are conventionally protected by ceramic interfaces 66, and the stack is encapsulated radially by an insulating coating 68.

The arrows CC show a compressive stress applied to the 3-3 piezoelectric stack.

When the stress CC is sufficiently high to induce a deformation of the 3-3 piezoelectric stack, an electrical voltage is generated between each electrode, and the electrodes of each piezoelectric capacitor move closer together, decreasing the capacitance of said equivalent capacitor.

Figure 7:
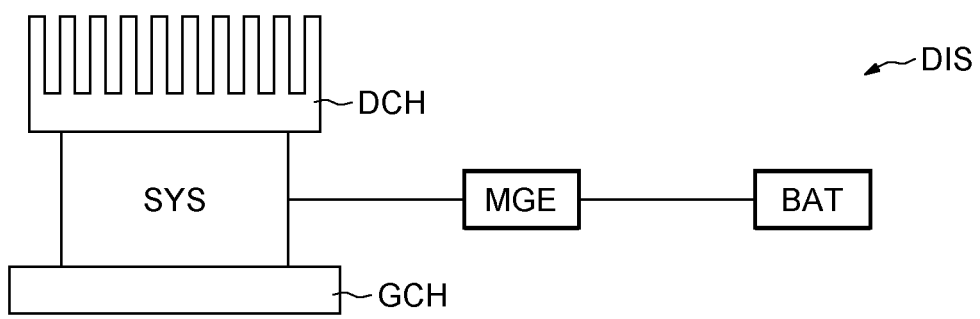
FIG. 7 schematically illustrates an energy-recovering device powering a load.

FIG. 7 shows an energy-recovering device DIS used as a power source to power a load BAT.

The device DIS comprises a system SYS such as described above, the heat source TC of which either makes contact with or is near to a generator GCH of heat, and the cold source TF of which either makes contact with or is near to a heatsink DCH.

The generator GCH of heat may for example be a hot element of an electronic circuit in operation, such as a microcontroller, or any other heat source.

The heatsink may for example be a radiator or any other cold source.

The thermal gradient between the heat source TC and cold source TF, of temperatures set by the generator GCH of heat and the heatsink DCH, respectively, allows the system SYS to generate electrical power.

The piezoelectric elements of the system SYS are connected to a power-storing means BAT, a capacitor for example, able to store electrical power, via a power-managing means MGE configured to optimise the charging of the means BAT on the basis of voltage signals produced by the piezoelectric elements 3 of the system SYS.

The invention claimed is:

1. A system for converting thermal energy into electrical power, comprising:
   a frame,
   at least one temperature-sensitive element having a first end and a second end, said at least one temperature-sensitive element being held in the frame at said first and second ends in a position between a heat source and a cold source, and
   at least one piezoelectric element placed between at least one portion of the frame and at least the first end of said at least one temperature-sensitive element,
   wherein said at least one temperature-sensitive element is configured to deform cyclically between two states under the action of a thermal gradient between the heat source and the cold source while exerting a stress during its cyclic deformation on said at least one piezoelectric element via said first end.

2. The energy-converting system according to claim 1, wherein the temperature-sensitive element makes, when it is in at least one of its two states, contact with one or other of the heat source and cold source.

3. The energy-converting system according to claim 1, wherein the temperature-sensitive element comprises a bimetallic strip.

4. The energy-converting system according to claim 1, wherein a central portion of the temperature-sensitive element includes a stamped structure.

5. The energy-converting system according to claim 1, further comprising a fastening element that is placed between said first end of the temperature-sensitive element and the piezoelectric element, said fastening element configured to hold the temperature-sensitive element by said first end.

6. The energy-converting system according to claim 1, wherein the piezoelectric element comprises a stack of piezoelectric capacitors connected in parallel.

7. The energy-converting system according to claim 1, wherein said stress on the piezoelectric element is a compressive stress.

8. The energy-converting system according to claim 1, wherein the piezoelectric element is insulated from the transfer of heat between said heat source and said cold source.

9. An energy-recovering device, comprising:
an energy-converting system comprising:
   a frame,
   at least one temperature-sensitive element having a first end and a second end, said at least one temperature-sensitive element being held in the frame at said first and second ends in a position between a heat source and a cold source, and
   at least one piezoelectric element placed between at least one portion of the frame and at least the first end of said at least one temperature-sensitive element,
   wherein said at least one temperature-sensitive element is configured to deform cyclically between two states under the action of a thermal gradient between the heat source and the cold source while exerting a stress during its cyclic deformation on said at least one piezoelectric element via said first end; and
   a power-storing device coupled to the piezoelectric element and configured to store the power produced by the piezoelectric element.

10. A system for converting thermal energy into electrical power, comprising:
   a temperature-sensitive element having a first end and a second end;
   a pair of fastening elements configured to hold the first and second ends of the temperature-sensitive element; and
   a piezoelectric element positioned in contact with one fastening element of the pair of fastening elements;
   wherein the temperature-sensitive element is configured to deform cyclically between two states under the action of a thermal gradient, with each cyclical deformation exerting a stress on the piezoelectric element.

11. The energy-converting system according to claim 10, wherein the temperature-sensitive element makes, when it is in at least one of its two states, contact with one or other of a heat source and a cold source which produce said thermal gradient.

12. The energy-converting system according to claim 10, wherein the temperature-sensitive element comprises a bimetallic strip.

13. The energy-converting system according to claim 10, wherein a central portion of the temperature-sensitive element includes a stamped structure.

14. The energy-converting system according to claim 10, wherein a heat source and a cold source produce said thermal gradient, further comprising a thermally insulating structure positioned between the heat and cold sources and the piezoelectric element.

15. The energy-converting system according to claim 10, wherein the piezoelectric element comprises a stack of piezoelectric capacitors connected in parallel.

* * * * *